(12) United States Patent  (10) Patent No.: US 7,538,719 B2
Kanaya  (45) Date of Patent: May 26, 2009

(54) MIXER CIRCUIT AND RADAR TRANSCEIVER

(75) Inventor: Ko Kanaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 11/957,542

(22) Filed: Dec. 17, 2007

(65) Prior Publication Data

US 2009/0015465 A1 Jan. 15, 2009

(30) Foreign Application Priority Data

Jul. 9, 2007 (JP) ............................. 2007-180146

(51) Int. Cl.
*G01S 7/28* (2006.01)
*G06G 7/16* (2006.01)
(52) U.S. Cl. ..................... 342/175; 342/70; 327/356
(58) Field of Classification Search ............... 342/175, 342/70–72
See application file for complete search history.

(56) References Cited

U.S. PATENT DOCUMENTS

| | | | |
|---|---|---|---|
| 6,931,246 B2 * | 8/2005 | Iwatani et al. ............... | 455/326 |
| 6,970,688 B2 | 11/2005 | Nibe | |
| 7,363,020 B2 * | 4/2008 | Kanaya ....................... | 455/323 |
| 2008/0278370 A1 * | 11/2008 | Lachner et al. .............. | 342/200 |
| 2009/0015465 A1 * | 1/2009 | Kanaya ....................... | 342/200 |

FOREIGN PATENT DOCUMENTS

| | | | |
|---|---|---|---|
| JP | 57201873 A | * | 12/1982 |
| JP | 1-227553 A | | 9/1989 |
| JP | 05134030 A | * | 5/1993 |
| JP | 8-265048 A | | 10/1996 |
| JP | 9-74316 A | | 3/1997 |
| JP | 2003-110316 A | | 4/2003 |
| JP | 2004-166260 A | | 6/2004 |
| JP | 2005-295097 A | | 10/2005 |

* cited by examiner

*Primary Examiner*—John B Sotomayor
(74) *Attorney, Agent, or Firm*—Leydig, Voit & Mayer, Ltd.

(57) ABSTRACT

A mixer circuit includes: a rat race circuit including a ring-shaped transmission line with a first terminal, a second terminal, a third terminal, and a fourth terminal, the first to fourth terminals being disposed, in that order, clockwise along the transmission line and equally spaced $\lambda_{LO}/4$ from one another, except that the first terminal is spaced $3*\lambda_{LO}/4$ from the fourth terminal, where $\lambda_{LO}$ is the wavelength of the LO signal applied to the mixer circuit; an LO terminal connected to the first terminal; a first diode and a second diode connected in the same polarity to the second terminal and the fourth terminal, respectively; and an RF terminal and an IF terminal both connected to the third terminal. The frequency of the LO signal is one-half of the frequency of the RF signal applied to the mixer circuit.

12 Claims, 5 Drawing Sheets

MIXER CIRCUIT AND RADAR TRANSCEIVER

BACKGROUND OF THE INVENTION

1. Field of the Invention

The present invention relates to a mixer circuit and a radar transceiver, and more particularly to a mixer circuit and a radar transceiver for use in electronic devices and microwave and millimeter wave communication devices for mobile communications and wireless communications.

2. Description of the Related Art

In recent years, there has been an increasing need to reduce the size and increase the power of microwave and millimeter wave communication devices. Since it is not easy to directly generate an oscillating signal at a high frequency such as a millimeter wave frequency, the transmitter circuit in microwave and millimeter wave radar devices generates an oscillating signal at a frequency lower than the transmit frequency and up-converts it to a frequency an n multiple of the original frequency by use of a frequency multiplier (where n is a natural number equal to or greater than 2). The up-converted signal is then transmitted through the transmitting antenna.

For example, in the transmitter of an automobile radar device, the local oscillator generates a 38 GHz oscillating signal, which is amplified by an amplifier and up-converted to 76 GHz by a frequency multiplier before being transmitted through the transmitting antenna.

In the receiver circuit of the radar device, on the other hand, the radio frequency signal (RF signal) having a frequency $f_{RF}$ received through the antenna is down-converted to an intermediate frequency signal (IF signal) at a frequency $f_{IF}$ by a mixer driven by the local oscillator signal (LO signal) having a frequency $f_{LO}$ generated by the local oscillator.

In the case of a mixer in an automobile radar receiver, for example, when the frequency $f_{LO}$ of the LO signal is 38 GHz, the frequency $f_{RF}$ of the RF signal is approximately (but not exactly) 76 GHz. Therefore, the receiver mixer outputs the mixing component at the frequency $f_{RF}-2*f_{LO}$ as an IF signal. That is, the RF signal is down-converted to the IF signal (having a frequency $f_{IF}$) by mixing the RF signal with the LO signal having a frequency (approximately) one-half of the frequency $f_{RF}$ Of the RF signal. In this case, the radar device requires two antennas, namely, a transmitting antenna and a receiving antenna.

One such mixer circuit employs a rat race circuit (or hybrid ring) that includes first and second antiparallel diode pairs. The mixer circuit down-converts the RF signal to an IF signal by mixing the RF signal with the LO signal. (The IF signal has a frequency equal to the difference between the frequency of the RF signal and the frequency of the second harmonic of the LO signal.) It has been suggested that this mixer circuit can be used as both an up-converter and a down-converter. (See, e.g., JP-A-9-74316, paragraphs 0045 to 0053, FIG. 5.)

Another exemplary mixer circuit employs a rat race circuit that allows the mixer to be used for both transmission and reception when the frequency of the RF signal is not an n multiple of the frequency of the LO signal (where n is a natural number equal to or greater than 2). (See, e.g., JP-A-1-227553, lower left column on page 324, to lower right column on page 325, FIG. 4.)

Two other exemplary mixer circuits are adapted for use when the frequency of the RF signal is substantially equal to (not an n multiple of) the frequency of the LO signal. One uses a rat race circuit as a balun, while the other uses a Marchand balun. (See, e.g., JP-A-8-265048, paragraphs 0004 and 0007, FIGS. 9 and 10.)

Yet another exemplary mixer circuit includes a pair of antiparallel diodes having different junction sizes and hence different impedances. This circuit receives on its input terminal an IF signal and a signal having a frequency equal to one-half of the frequency of an LO signal and outputs on its output terminal an RF signal and the LO signal. Since this mixer circuit does not exhibit as much LO signal reducing effect as conventional mixer circuits, the output LO signal has a higher power. (See, e.g., JP-A-2004-166260, paragraphs 0041 to 0051, FIGS. 1 to 4.)

Further, one exemplary radio communication device adapted to operate at 30 GHz and higher frequencies includes an antiparallel diode pair having first and second terminals. In operation, a local oscillator signal (having a frequency $f_{LO}$) is input to the first terminal and an information signal (having a frequency $f_{IF}$) and a DC bias are applied to the second terminal, with the result that the n-th harmonic of the LO signal (i.e., $n*f_{LO}$) and the mixing components at the frequencies $n*f_{LO} \pm f_{IF}$ are produced at the second terminal, where n is a natural number equal to or greater than 2. (See, e.g., JP-A-2005-295097, paragraphs 0017 to 0019, FIG. 1.)

However, in order that a transceiver employing a conventional mixer circuit as described above function with only one antenna (for cost saving purposes), the transceiver must include a switch or a circulator to switch between the transmitter (or transmit mode) and the receiver (or receive mode). However, inserting such a component between the transceiver and the transmitting/receiving antenna may result in reduced transmission power and an increased noise factor.

Furthermore, this also prevents the transceiver from transmitting and receiving signals concurrently.

SUMMARY OF THE INVENTION

The present invention has been devised to solve the above problems. It is, therefore, a primary object of the present invention to provide a relatively simple mixer circuit capable of generating an even harmonic of a received local oscillator signal and further generating an intermediate frequency signal from a received radio frequency signal having a frequency close to the frequency of the even harmonic of the local oscillator signal, and capable of allowing concurrent use of the generated even harmonic of the local oscillator signal and the generated intermediate frequency signal. It is a secondary object of the present invention to provide a radar transceiver using the above simple mixer circuit.

According to one aspect of the present invention, there is provided a mixer circuit comprising: a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends being equally spaced of a first electrical path length from one another in that order, and the fourth coupling end to the first coupling end being spaced of a second electrical path length in the predetermined direction; a first coupling circuit for receiving a local oscillator signal having a first frequency, the first coupling circuit being connected to the first coupling end; a second coupling circuit for passing therethrough a radio frequency signal having a second frequency an even multiple of the first frequency, said second coupling circuit being connected to the third coupling end; a first diode element and a second diode element connected in the same polarity to ground potential, the first diode element being connected between the second coupling end and the ground potential, the second diode element being connected between the fourth coupling end and the ground potential; and a filter circuit for passing therethrough an intermediate frequency signal determined by the local oscillator signal and the radio frequency signal, the filter circuit being connected to a fifth coupling end provided to the transmission line at a position spaced from the first coupling end by an electrical path length of double the first electrical path length along the transmission line; wherein the first electrical path length is approximately one-quarter wavelength of the local oscillator signal and the second electrical path length is approximately three-quarters wavelength of the local oscillator signal.

Accordingly, in the mixer circuit according to the present invention, there can be constituted the first and second diode elements are connected in the same polarity to ground potential (i.e., either their anodes or cathodes are connected to the ground potential). This arrangement allows the first and second diode elements to be driven by a local oscillator signal having a frequency equal to a frequency of a radio frequency signal multiplied by $1/(2*n)$ (where n is a natural number) to produce an intermediate frequency signal having a frequency equal to the difference between a frequency of a input radio frequency signal having a frequency approximately equal to an even multiple (or $2*n$ multiple) of the frequency of the local oscillator signal and the radio frequency signal having the frequency equal to an even multiple (or $2*n$ multiple) of the frequency of the local oscillator signal and at the same time to produce the radio frequency signal having a frequency equal to an even multiple (or $2*n$ multiple) of the frequency of the local oscillator signal.

According to another aspect of the present invention, there is provided a mixer circuit comprising: a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends being equally spaced of a first electrical path length from one another in that order, and the fourth coupling end to the first coupling end being spaced of a second electrical path length in the predetermined direction; a first coupling circuit for receiving a local oscillator signal having a first frequency, the first coupling circuit being connected to the third coupling end; a second coupling circuit for passing therethrough a radio frequency signal having a second frequency an even multiple of the first frequency, the second coupling circuit being connected to the first coupling end; a first diode element and a second diode element connected in reverse polarity to ground potential, the first diode element being connected between the second coupling end and the ground potential, the second diode element being connected between the fourth coupling end and the ground potential; and a filter circuit for passing therethrough an intermediate frequency signal determined by the local oscillator signal and the radio frequency signal, the filter circuit being connected to a fifth coupling end provided to the transmission line at a position spaced from the first coupling end by an electrical path length of double the first electrical path length along the transmission line; wherein the first electrical path length is approximately one-quarter wavelength of the local oscillator signal and the second electrical path length is approximately three-quarters wavelength of the local oscillator signal.

Accordingly, in the mixer circuit according to the present invention, there can be constituted the first and second diode elements are connected in the reverse polarity to ground potential (i.e., an anode of either the first diode or the second diode is connected to the ground potential). This arrangement allows the first and second diode elements to be driven by a local oscillator signal having a frequency equal to a frequency of a radio frequency signal multiplied by $1/(2*n)$ (where n is a natural number) to produce an intermediate frequency signal having a frequency equal to the difference between a frequency of a input radio frequency signal having a frequency approximately equal to an even multiple (or $2*n$ multiple) of the frequency of the local oscillator signal and the radio frequency signal having the frequency equal to an even multiple (or $2*n$ multiple) of the frequency of the local oscillator signal and at the same time to produce the radio frequency signal having a frequency equal to an even multiple (or $2*n$ multiple) of the frequency of the local oscillator signal.

According to further aspect of the present invention, there is provided a mixer circuit comprising: a three terminal coupling circuit including an input end for receiving a local oscillator signal having a predetermined frequency, a first output end and a second output end for outputting signals 180° out of phase with each other; a first diode element and a second diode element connected in the same polarity to the first output end and the second output end, respectively, of the three terminal coupling circuit; a four terminal coupling circuit including, a first line having a first coupling end grounded through a terminating resistance and a second coupling end for passing therethrough a radio frequency signal having a frequency an even multiple of the predetermined frequency of the local oscillator signal, the first line having an electrical length of approximately one-quarter wavelength of the radio frequency signal between the first and second coupling ends, a second line disposed parallel to the first line, having a third coupling end connected to the first output end of the three terminal coupling circuit through the first diode element and a fourth coupling end connected to the second output end of the three terminal coupling circuit through the second diode element, the third coupling end and the fourth coupling end being juxtaposed to the first and second coupling ends, respectively, of the first line; a phase adjustment circuit connected between the fourth coupling end of the four terminal coupling circuit and the second diode element and having an electrical length of approximately one-quarter wavelength of the radio frequency signal; and a filter circuit for passing therethrough an intermediate frequency signal determined by the local oscillator signal and the radio frequency signal, the filter circuit being either connected to the junctions between the phase adjustment circuit and the second diode element and between the third coupling end of the four terminal coupling circuit and the first diode element, or connected to the junctions between the first diode element and the three terminal coupling circuit and between the second diode element and the three terminal coupling circuit.

Accordingly, in the mixer circuit according to the present invention, The arrangement allow the first and second diode elements to be driven by a local oscillator signal having a frequency equal to a frequency of a radio frequency signal multiplied by $1/(2*n)$ (where n is a natural number) to produce an intermediate frequency signal having a frequency equal to the difference between a frequency of a input radio frequency signal having a frequency approximately equal to an even multiple (or $2*n$ multiple) of the frequency of the local oscillator signal and the radio frequency signal having the frequency equal to an even multiple (or $2*n$ multiple) of the frequency of the local oscillator signal and at the same time to produce the radio frequency signal having a frequency equal to an even multiple (or $2*n$ multiple) of the frequency of the local oscillator signal.

According to still further aspect of the present invention, there is provided a mixer circuit comprising: a first four terminal coupling circuit including, a first line having a first coupling end for passing therethrough a radio frequency signal having a frequency an even multiple of a predetermined frequency of a local oscillator signal and a second coupling end for receiving the local oscillator signal having the predetermined frequency, the first line having an electrical length of approximately one-quarter wavelength of the radio frequency signal between the first and second coupling ends, and the second line disposed parallel to the first line and having a third coupling end and a fourth coupling end juxtaposed to the first and second coupling ends, respectively, of the first line; a first diode element and a second diode element indirectly connected in the same polarity to the third coupling end and the fourth coupling end, respectively, of the first four terminal coupling circuit; a phase adjustment circuit connected between the second diode element and the fourth coupling end of the first four terminal coupling circuit and having an electrical length of approximately one-quarter wavelength of the local oscillator signal; a second four terminal coupling circuit including, a first line having a first coupling end connected to the third coupling end of said first four terminal coupling circuit and a second coupling end grounded, the first line having an electrical length of approximately one-quarter wavelength of the local oscillator signal between the first and second coupling ends, and a second line disposed parallel to the first line having a third coupling end grounded and a fourth coupling end connected to the first diode element, the second line having the third coupling end and the fourth coupling end juxtaposed to the first and second coupling ends, respectively, of the first line, and the second four terminal coupling circuit being connected between the third coupling end of the first four terminal coupling circuit and the first diode element; a filter circuit for passing therethrough an intermediate frequency signal determined by the local oscillator signal and the radio frequency signal including, a first coupling end connected to the first diode element indirectly connected to the third coupling end of the first four terminal coupling circuit, and a second coupling end connected to the second diode element indirectly connected to the fourth coupling end of the first four terminal coupling circuit.

Accordingly, in the mixer circuit according to the present invention, there can be constituted the first and second diode elements are connected in the reverse polarity to ground potential (i.e., an anode of either the first diode or the second diode is connected to the ground potential). This arrangement allows the first and second diode elements to be driven by a local oscillator signal having a frequency equal to a frequency of a radio frequency signal multiplied by 1/(2*n) (where n is a natural number) to produce an intermediate frequency signal having a frequency equal to the difference between a frequency of a input radio frequency signal having a frequency approximately equal to an even multiple (or 2*n multiple) of the frequency of the local oscillator signal and the radio frequency signal having the frequency equal to an even multiple (or 2*n multiple) of the frequency of the local oscillator signal and at the same time to produce the radio frequency signal having a frequency equal to an even multiple (or 2*n multiple) of the frequency of the local oscillator signal.

According to still further aspect of the present invention, there is provided a radar transceiver comprising: a mixer circuit comprising, a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends equally spaced of a first electrical path length from one another in that order, and the fourth coupling end to the first coupling end being spaced of a second electrical path length in the predetermined direction, a first coupling circuit for receiving a local oscillator signal having a first frequency, the first coupling circuit being connected to the first coupling end, a second coupling circuit for passing therethrough a radio frequency signal having a second frequency of an even multiple of the first frequency, the second coupling circuit being connected to the third coupling end, a first diode element and a second diode element connected in the same polarity to ground potential, the first diode element being connected between the second coupling end and the ground potential, the second diode element being connected between the fourth coupling end and the ground potential, and a filter circuit for passing therethrough an intermediate frequency signal determined by the local oscillator signal and the radio frequency signal, the filter circuit being connected to a fifth coupling end provided to the transmission line at a position spaced from the first coupling end by an electrical path length of double the first electrical path length along the transmission line, wherein the first electrical path length is approximately one-quarter wavelength of the local oscillator signal and the second electrical path length is approximately three-quarters wavelength of the local oscillator signal; and a local oscillator circuit connected to the first coupling circuit of the mixer circuit; wherein a transmitting/receiving antenna is coupled to the second coupling circuit of the mixer circuit; and wherein an intermediate frequency signal processing circuit is connected to the filter circuit of said mixer circuit.

Accordingly, in the radar transceiver according to the present invention, the radar transceivers can generate an even harmonic of the local oscillator signal while at the same time receiving a radio frequency signal and down-converting it to an intermediate frequency signal by mixing the radio frequency signal with the local oscillator signal. This allows the radar device to perform transmission and reception operations concurrently and thereby continuously operate without interruption. Further, the transceivers can use a transmitting/receiving (or bidirectional) antenna without using a switch or circulator, resulting in a reduction in the size of the radar device.

According to still further aspect of the present invention, there is provided a radar transceiver comprising: a mixer circuit comprising, a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends equally spaced of a first electrical path length from one another in that order, and the fourth coupling end to the first coupling end being spaced of a second electrical path length in said predetermined direction, a first coupling circuit for receiving a local oscillator signal having a first frequency, said first coupling circuit being connected to the third coupling end, a second coupling circuit for passing therethrough a radio frequency signal having a second frequency of an even multiple of the first frequency, said second coupling circuit being connected to the first coupling end, a first diode element and a second diode element connected in reverse polarity to ground potential, said first diode element being connected between the second coupling end and the ground potential, said second diode element being connected between the fourth coupling end and the ground potential, and a filter circuit for passing therethrough an intermediate frequency signal determined by the local oscillator signal and the radio frequency signal, said filter circuit being connected to a fifth coupling end provided to the transmission line at a position spaced from the first coupling end by an electrical path length of double the first electrical path length along the transmission line, wherein the first electrical path length is approximately one-quarter wavelength of the local oscillator signal and the second electrical path length is approximately three-quarters wavelength of the local oscillator signal; and a local oscillator circuit connected to the first coupling circuit of said mixer circuit; wherein a transmitting/receiving antenna is coupled to the second coupling circuit of said mixer circuit; and wherein an intermediate frequency signal processing circuit is connected to the filter circuit of said mixer circuit.

Accordingly, in the radar transceiver according to the present invention, the radar transceivers can generate an even harmonic of the local oscillator signal while at the same time receiving a radio frequency signal and down-converting it to an intermediate frequency signal by mixing the radio frequency signal with the local oscillator signal. This allows the radar device to perform transmission and reception operations concurrently and thereby continuously operate without interruption. Further, the transceivers can use a transmitting/receiving (or bidirectional) antenna without using a switch or circulator, resulting in a reduction in the size of the radar device.

According to still further aspect of the present invention, there is provided a radar transceiver comprising: a mixer circuit comprising, a three terminal coupling circuit including an input end for receiving a local oscillator signal having a predetermined frequency, a first output end and a second output end for outputting signals 180° out of phase with each other; a first diode element and a second diode element connected in the same polarity to the first output end and the second output end, respectively, of the three terminal coupling circuit; a four terminal coupling circuit including, a first line having a first coupling end grounded through a terminating resistance and a second coupling end for passing therethrough a radio frequency signal having a frequency an even multiple of the predetermined frequency of the local oscillator signal, the first line having an electrical length of approximately one-quarter wavelength of the radio frequency signal between the first and second coupling ends, a second line disposed parallel to the first line, having a third coupling end connected to the first output end of the three terminal coupling circuit through the first diode element and a fourth coupling end connected to the second output end of the three terminal coupling circuit through the second diode element, the third coupling end and the fourth coupling end being juxtaposed to the first and second coupling ends, respectively, of the first line; and a phase adjustment circuit connected between the fourth coupling end of the four terminal coupling circuit and the second diode element and having an electrical length of approximately one-quarter wavelength of the radio frequency signal; and a filter circuit for passing therethrough an intermediate frequency signal determined by the local oscillator signal and the radio frequency signal, the filter circuit being either connected to the junctions between the phase adjustment circuit and the second diode element and between the third coupling end of the four terminal coupling circuit and the first diode element, or connected to the junctions between the first diode element and the three terminal coupling circuit and between the second diode element and the three terminal coupling circuit; and a local oscillator circuit connected to the input end of the three terminal coupling circuit of the mixer circuit; wherein a transmitting/receiving antenna is coupled to the second coupling end of the four terminal coupling circuit of the mixer circuit; and wherein an intermediate frequency signal processing circuit is connected to the filter circuit of the mixer circuit.

Accordingly, in the radar transceiver according to the present invention, the radar transceivers can generate an even harmonic of the local oscillator signal while at the same time receiving a radio frequency signal and down-converting it to an intermediate frequency signal by mixing the radio frequency signal with the local oscillator signal. This allows the radar device to perform transmission and reception operations concurrently and thereby continuously operate without interruption. Further, the transceivers can use a transmitting/receiving (or bidirectional) antenna without using a switch or circulator, resulting in a reduction in the size of the radar device.

According to still further aspect of the present invention, there is provided a radar transceiver comprising: a mixer circuit comprising, a first four terminal coupling circuit including, a first line having a first coupling end for passing therethrough a radio frequency signal having a frequency an even multiple of a predetermined frequency of a local oscillator signal and a second coupling end for receiving the local oscillator signal having the predetermined frequency, the first line having an electrical length of approximately one-quarter wavelength of the radio frequency signal between the first and second coupling ends, and the second line disposed parallel to the first line and having a third coupling end and a fourth coupling end juxtaposed to the first and second coupling ends, respectively, of the first line, a first diode element and a second diode element indirectly connected in the same polarity to the third coupling end and the fourth coupling end, respectively, of the first four terminal coupling circuit; a phase adjustment circuit connected between the second diode element and the fourth coupling end of the first four terminal coupling circuit and having an electrical length of approximately one-quarter wavelength of the local oscillator signal; a second four terminal coupling circuit including, a first line having a first coupling end connected to the third coupling end of said first four terminal coupling circuit and a second coupling end grounded, the first line having an electrical length of approximately one-quarter wavelength of the local oscillator signal between the first and second coupling ends, and a second line disposed parallel to the first line having a third coupling end grounded and a fourth coupling end connected to the first diode element, the second line having the third coupling end and the fourth coupling end juxtaposed to the first and second coupling ends, respectively, of the first line, the second four terminal coupling circuit being connected between the third coupling end of the first four terminal coupling circuit and the first diode element; a filter circuit for passing therethrough an intermediate frequency signal determined by the local oscillator signal and the radio frequency signal including, a first coupling end connected to the first diode element indirectly connected to the third coupling end of the first four terminal coupling circuit, and a second coupling end connected to the second diode element indirectly connected to the fourth coupling end of the first four terminal coupling circuit; and a local oscillator circuit connected to the second coupling end of the first four terminal coupling circuit of said mixer circuit; wherein a transmitting/receiving antenna is coupled to the first coupling end of the first four terminal coupling circuit of said mixer circuit; and wherein an intermediate frequency signal processing circuit is connected to the filter circuit of said mixer circuit.

Accordingly, in the radar transceiver according to the present invention, the radar transceivers can generate an even harmonic of the local oscillator signal while at the same time receiving a radio frequency signal and down-converting it to an intermediate frequency signal by mixing the radio frequency signal with the local oscillator signal. This allows the radar device to perform transmission and reception operations concurrently and thereby continuously operate without interruption. Further, the transceivers can use a transmitting/receiving (or bidirectional) antenna without using a switch or circulator, resulting in a reduction in the size of the radar device.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

It is to be noted that the following description uses the term "diode element" to refer to an ordinary diode as well as to an FET with its drain and source connected together (functioning as a diode) and to the base-collector pn diode and the base-emitter pn diode of an HBT.

First Embodiment

Figure 1:
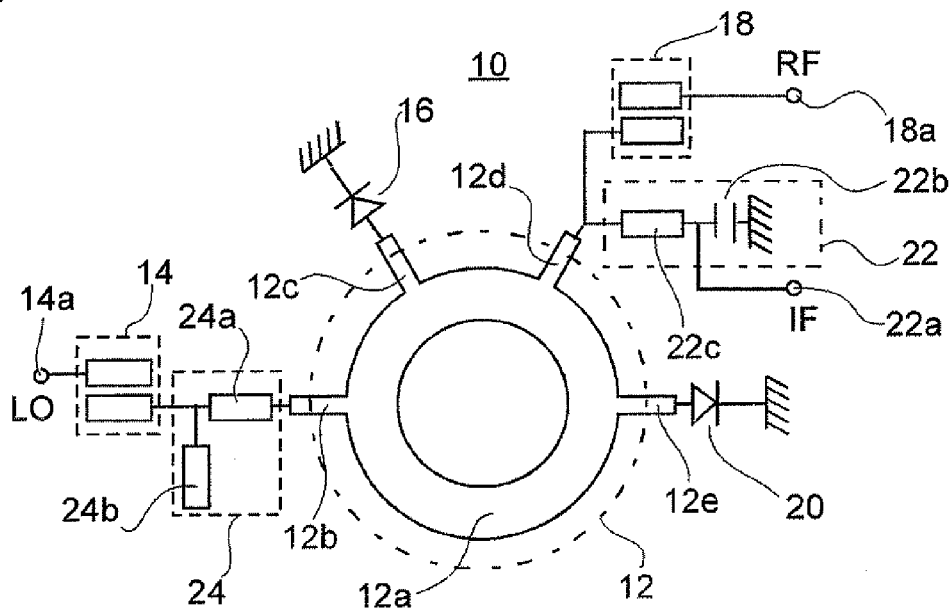
FIG. 1 is a block diagram showing a mixer circuit according to one embodiment of the present invention.

FIG. 1 is a block diagram showing a mixer circuit according to one embodiment of the present invention. It should be noted that in the figures, like numerals are used to denote like or corresponding components.

Referring to FIG. 1, this mixer circuit (10) includes a rat race circuit 12 (serving as a power distribution circuit), a coupled line 14 (serving as a first coupling circuit), a diode 16 (serving as a first diode element), a coupled line 18 (serving as a second coupling circuit), a diode 20 (serving as a second diode element), and an IF filter circuit 22 (serving as a filter circuit).

The rat race circuit 12 includes a closed ring-shaped ring circuit 12a (serving as a transmission line) which is provided with a first terminal 12b (serving as a first coupling end or port), a second terminal 12c (serving as a second coupling end), a third terminal 12d (serving as a third coupling end), and a fourth terminal 12e (serving as a fourth coupling end) disposed in that order in the clockwise direction along the ring circuit 12a.

The coupled line 14 has an LO terminal 14a to receive an LO signal from a local oscillator (not shown). The coupled line 14 has an electrical length of one-quarter wavelength of the LO signal and is connected to the first terminal 12b of the ring circuit 12a through a circuit 24 (serving as a high impedance circuit) having a high impedance to the input RF signal.

The circuit 24 (effectively acting as an open circuit to the REF signal) includes: a transmission line 24a connected between the coupled line 14 and the first terminal 12b and having an electrical length of one-quarter wavelength of the RF signal; and an open-circuited stub 24b connected to the junction between the transmission line 24a and the coupled line 14 and having an electrical length of one-quarter wavelength of the RF signal. It should be noted that the circuit 24 may be replaced by a circuit having a high impedance of 300-400 O or more.

The diode 16 is connected between the second terminal 12c and the ground potential with its cathode connected to the ground potential.

The coupled line 18 has an RF terminal 18a to transmit or receive the RF signal. The coupled line 18 has an electrical length of one-quarter wavelength of the RF signal and is connected to the third terminal 12d.

The IF filter circuit 22 has an IF terminal 22a to transmit or receive an IF signal determined by the RF signal and the LO signal. The IF filter circuit 22 includes a short-circuited stub 22c grounded through a DC blocking capacitor 22b and having an electrical length of one-quarter wavelength of the RF signal. According to the present embodiment, the IF filter circuit 22 is connected to the third terminal 12d.

The diode 20 is connected between the fourth terminal 12e and ground potential with its cathode connected to the ground potential.

In the ring circuit 12a, the transmission line sections between the first terminal 12b and the second terminal 12c, between the second terminal 12c and the third terminal 12d, and between the third terminal 12d and the fourth terminal 12e each have an electrical length of one-quarter wavelength of the LO signal. Further, the transmission line section between the fourth terminal 12e and the first terminal 12b has an electrical length of three-quarters wavelength of the LO signal.

The frequency $f_{LO}$ of the LO signal is equal to the frequency $f_{RF}$ of the RF signal multiplied by $1/(2*n)$, that is, $f_{LO}=f_{RF}/(2*n)$, where n is a natural number.

In the case of automobile radar devices, for example, $f_{RF}$ is 76 GHz, and $f_{LO}$ is 38 GHz.

Figure 2:
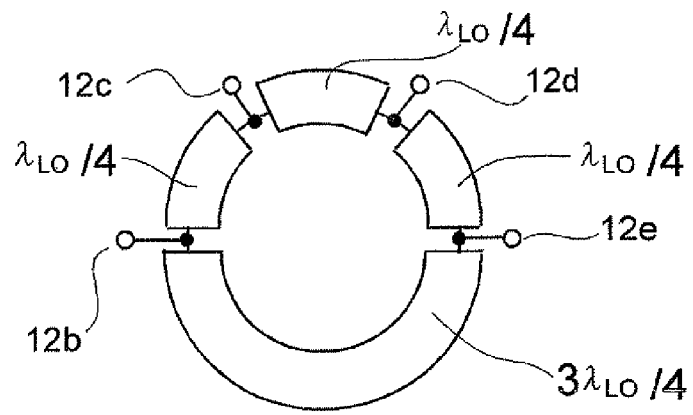
FIGS. 2 and 3 are schematic diagrams illustrating the operation of the rat race circuit according to one embodiment of the present invention.
Figure 3:
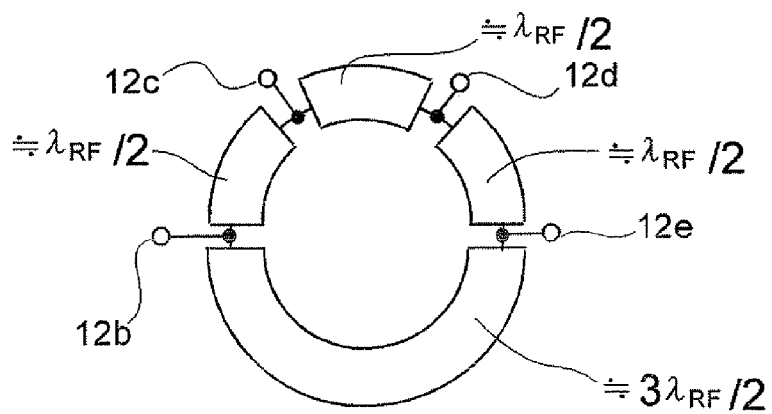

FIGS. 2 and 3 are schematic diagrams illustrating the operation of the rat race circuit according to one embodiment of the present invention. Specifically, FIG. 2 illustrates how the input LO signal travels through the rat race circuit, and FIG. 3 illustrates how the input RF signal travels through the rat race circuit.

Referring to FIG. 2, the LO signal input to the first terminal 12b is split into two components that travel, respectively, clockwise and counterclockwise through the ring circuit. The second terminal 12c is spaced a clockwise distance of $\lambda_{LO}/4$ and a counterclockwise distance of $5*\lambda_{LO}/4$ from the first terminal 12b around the ring, giving a difference of $\lambda_{LO}$ between these clockwise and counterclockwise distances, where $\lambda_{LO}$ is the wavelength of the LO signal (see FIG. 2). Therefore, the two split components of the LO signal (traveling, respectively, clockwise and counterclockwise through the ring circuit) arrive in phase at the second terminal 12c.

Likewise, the fourth terminal 12e is spaced a clockwise distance of $3*\lambda_{LO}/4$ and a counterclockwise distance of $3*\lambda_{LO}/4$ from the first terminal 12b. That is, these terminals are spaced from each other equally in the clockwise and counterclockwise directions. Therefore, the two split components of the LO signal also arrive in phase at the fourth terminal 12e.

On the other hand, the third terminal 12d is spaced a clockwise distance of $\lambda_{LO}/2$ and a counterclockwise distance of $\lambda_{LO}$ from the first terminal 12b, giving a difference of $\lambda_{LO}/2$ between these clockwise and counterclockwise distances. Therefore, the two split components of the LO signal arrive 180° out of phase and thereby cancel each other at the third terminal 12d.

As a result, the power of the input LO signal at the first terminal 12b is distributed equally, but 180° out of phase, between the second terminal 12c and the fourth terminal 12e.

Referring now to FIG. 3, the RF signal input to the third terminal 12d is split into two components that travel, respectively, clockwise and counterclockwise through the ring circuit. It should be noted that in this case the frequency $f_{RF}$ of the RF signal is approximately equal to double the frequency $f_{LO}$ of the LO signal ($f_{RF} \approx 2*f_{LO}$). (The frequency $f_{IF}$ of the IF signal is set to be extremely low as compared to the frequencies $f_{RF}$ and $f_{LO}$, that is, $f_{LO}, f_{RF} >> f_{IF}$.) Therefore, $\lambda_{LO}/4 \approx \lambda_{RF}/2$, where $\lambda_{RF}$ is the wavelength of the RF signal.

That is, the second terminal 12c is spaced a clockwise distance of approximately $5*\lambda_{RF}/2$ and a counterclockwise distance of approximately $\lambda_{RF}/2$ from the third terminal 12d around the ring, giving a difference of $2*\lambda_{RF}$ between these clockwise and counterclockwise distances (see FIG. 3). Therefore, the two split components of the RF signal (traveling, respectively, clockwise and counterclockwise through the ring circuit) arrive in phase at the second terminal 12c. Likewise, the fourth terminal 12e is spaced a clockwise distance of approximately $\lambda_{RF}/2$ and a counterclockwise distance of approximately $5*\lambda_{RF}/2$ from the third terminal 12d around the ring, giving a difference of $2*\lambda RF$ between these clockwise and counterclockwise distances. Therefore, the two split components of the RF signal also arrive in phase at the fourth terminal 12e. As a result, the power of the RF signal is distributed equally and in phase between the second terminal 12c and the fourth terminal 12e. These arrangements allow an IF signal to be generated at the frequency $f_{IF}$ (=$f_{RF}-2*f_{LO}$) at the third terminal 12d and output through the IF filter circuit 22 during reception, as well as allowing a second harmonic of the LO signal to be generated (at $2*f_{LO}$) at the third terminal 12d and output as a transmission signal during transmission.

According to the present embodiment, the circuit 24 is connected between the first terminal 12b and the LO terminal 14a and effectively appears as an open circuit to the RF signal and the IF signal at the first terminal 12b.

That is, the first terminal 12b of the ring circuit is effectively open-circuited at the frequency $f_{RF}$ of the RF signal ($\approx 2*f_{LO}$), thereby preventing a reduction in the power of the signals to be transmitted and received.

Thus, the mixer circuit 10 is constructed as follows. The LO terminal 14a is connected to the first terminal 12b through the coupled line 14 and the circuit 24 (effectively appearing as an open circuit to the RF signal). The diode 16 is connected between the second terminal 12c and ground potential with its cathode connected to the ground potential. The diode 20 is connected between the fourth terminal 12e and the ground potential with its cathode connected to the ground potential. The RF terminal 18a is connected to the third terminal 12d through the coupled line 18, and the IF terminal 22a is connected to the third terminal 12d through the IF filter circuit 22. When an RF signal is input to the third terminal 12d and an LO signal having a frequency (approximately) one-half of the frequency of the RF signal is input to the first terminal 12b, an IF signal having the frequency $f_{RF}-2*f_{LO}$ is output through the IF terminal 22a and, at the same time, a second harmonic of the LO signal is output through the RF terminal 18a. (This harmonic signal has a frequency of $2*f_{LO}$.)

Figure 4:
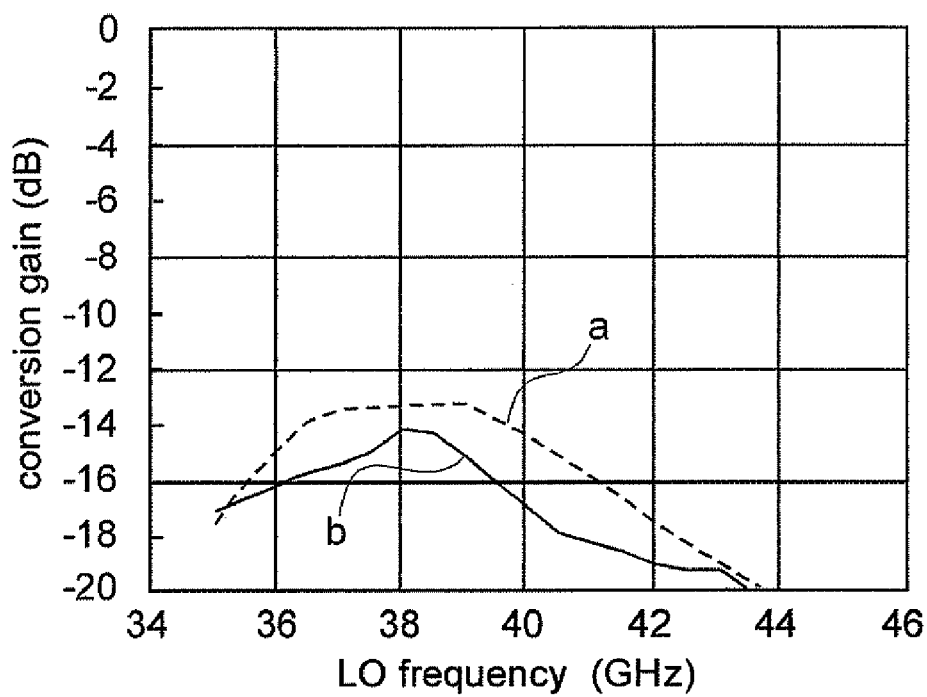
FIG. 4 is a graph showing calculated values of the transmission conversion gain and the reception conversion gain (defined below) of the mixer circuit according to one embodiment of the present invention.

FIG. 4 is a graph showing calculated values of the transmission conversion gain and the reception conversion gain (defined below) of the mixer circuit according to one embodiment of the present invention.

In FIG. 4, the horizontal axis represents the frequency of the local oscillator signal, and the vertical axis represents conversion gain. Symbol a denotes the transmission conversion gain (i.e., the ratio of the power of the second harmonic of the LO signal to the power of the LO signal), and symbol b denotes the reception conversion gain (i.e., the ratio of the power of the IF signal to that of the RF signal).

For example, when $f_{LO}$ is 38 GHz, the reception conversion gain is approximately −14 dB and the transmission conversion gain is approximately −13 dB.

Although in the present embodiment the cathodes of the diodes 16 and 20 are grounded, in other embodiments their anodes may be grounded. Further, although in the present embodiment the coupled lines 14 and 18 are made up of an LO filter circuit and an RF filter circuit, respectively, in other embodiment they may be made up of a capacitor(s) and an inductor(s).

According to the present embodiment, the IF terminal 22a and the RF terminal 18a are connected to the third terminal 12d, and the LO terminal 14a is connected to the first terminal 12b. In other embodiments, however, the IF terminal 22a and the RF terminal 18a may be connected to the first terminal 12b, and the LO terminal 14a may be connected to the third terminal 12d. However, in this case, the anode of either the diode 16 or 20 need be grounded.

Figure 5:
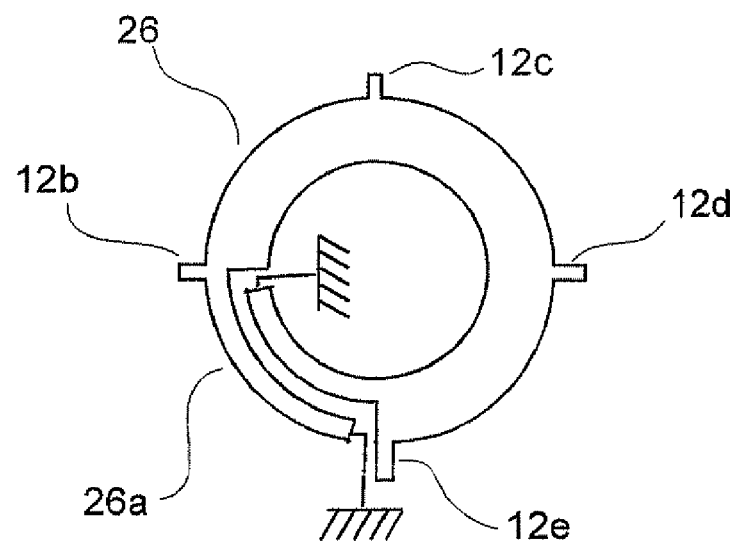
FIG. 5 is a schematic diagram of a variation of the rat race circuit according to one embodiment of the present invention.

FIG. 5 is a schematic diagram of a variation of the rat race circuit according to one embodiment of the present invention.

This rat race circuit 26 differs from the rat race circuit 12 in that the ring circuit includes a coupled line 26a as shown in FIG. 5. The transmission line sections between the first terminal 12b and the second terminal 12c, between the second terminal 12c and the third terminal 12d, and between the third terminal 12d and the fourth terminal 12e each have an electrical length of $\lambda_{LO}/4$, Further, a coupled line 26a having an electrical length of $\lambda_{LO}/4$ is connected between the fourth terminal 12e and the first terminal 12b.

The first to fourth terminals 12b to 12e of the rat race circuit 26 are connected to the LO terminal 14a, the RF terminal 18a, the IF terminal 22a, and other components in the same manner as those of the rat race circuit 12.

The rat race circuit 26 provides a wider signal bandwidth.

Figure 6:
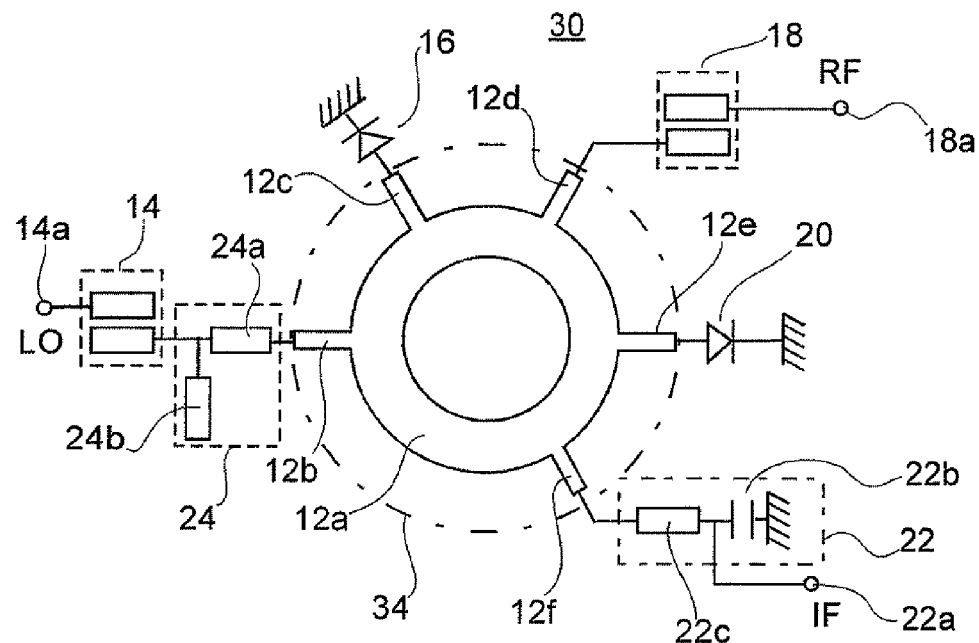
FIG. 6 is a block diagram showing a variation of a mixer circuit according to one embodiment of the present invention.

FIG. 6 is a block diagram showing a variation of a mixer circuit according to one embodiment of the present invention.

This mixer circuit 30 includes a five terminal rat race circuit 34 serving as a power distribution circuit. This mixer circuit also includes the coupled lines 14 and 18, the diodes 16 and 20, and the IF filter circuit 22 as does the mixer circuit 10, although some of them are connected to different terminals than in the mixer circuit 10. Except for this, the mixer circuit 30 is similar to the mixer circuit 10.

The ring circuit 12a of the rat race circuit 34 is additionally provided with a fifth terminal 12f (serving as a fifth coupling end) spaced a clockwise distance of one-quarter wavelength of the LO signal from the fourth terminal 12e around the ring. That is, the fifth terminal 12f is spaced a counterclockwise distance of one-half wavelength of the LO signal from the first terminal 12b.

In the rat race circuit 34, the coupled line 14 is connected to the first terminal 12b of the ring circuit 12a through the circuit 24 (effectively acting as an open circuit to the RF signal), as in the rat race circuit 12. Further, the diode 16 is connected between the second terminal 12c and ground potential with its cathode connected to the ground potential, and the diode 20 is connected between the fourth terminal 12e and the ground potential with its cathode connected to the ground potential, as in the rat race circuit 12.

However, unlike in the rat race circuit 12, the IF terminal 22a is connected to the fifth terminal 12f through the IF filter circuit 22, and hence only the RF terminal 18a is connected to the third terminal 12d by the coupled line 18.

In the rat race circuit 34, the LO signal input to the first terminal 12b is split into two components that travel, respectively, clockwise and counterclockwise through the ring circuit 12a. The second terminal 12c is spaced a clockwise distance of $\lambda_{LO}/4$ and a counterclockwise distance of $5*\lambda_{LO}/4$ from the first terminal 12b around the ring, giving a difference of $\lambda_{LO}$ between these clockwise and counterclockwise distances. Therefore, the two split components of the LO signal (traveling, respectively, clockwise and counterclockwise through the ring circuit) arrive in phase at the second terminal 12c.

Likewise, the fourth terminal 12e is spaced a clockwise distance of $3*\lambda_{LO}/4$ and a counterclockwise distance of $3*\lambda_{LO}/4$ from the first terminal 12b. That is, these terminals are spaced from each other equally in clockwise and counterclockwise directions. Therefore, the two split components of the LO signal also arrive in phase at the fourth terminal 12e.

On the other hand, the third terminal 12d is spaced a clockwise distance of $\lambda_{LO}/2$ and a counterclockwise distance of $\lambda_{LO}$ from the first terminal 12b, giving a difference of $\lambda_{LO}/2$ between these clockwise and counterclockwise distances. Therefore, the two split components of the LO signal arrive 180° out of phase and thereby cancel each other at the third terminal 12d. As for the fifth terminal 12f, the split components of the LO signal also arrive 180° out of phase and thereby cancel each other at this terminal.

As a result, the power of the input LO signal at the first terminal 12b is distributed equally between the second terminal 12c and the fourth terminal 12e.

On the other hand, the RF signal input to the third terminal 12d is also split into two components that travel, respectively, clockwise and counterclockwise through the ring circuit 12a. It should be noted that in this case the frequency $f_{RF}$ of the RF signal is approximately equal to double the frequency $f_{LO}$ of the LO signal ($f_{RF} \approx 2*f_{LO}$). (The frequency $f_{IF}$ of the IF signal is set to be extremely low as compared to the frequencies $f_{RF}$ and $f_{LO}$, that is, $f_{LO}, f_{RF} >> f_{IF}$.) Therefore, $\lambda_{LO}/4 \approx \lambda_{RF}/2$, where $\lambda_{RF}$ is the wavelength of the RF signal.

That is, the second terminal 12c is spaced a clockwise distance of approximately $5*\lambda_{RF}/2$ and a counterclockwise distance of approximately $\lambda_{RF}/2$ from the third terminal 12d around the ring, giving a difference of $2*\lambda_{RF}$ between these clockwise and counterclockwise distances. Therefore, the two split components of the RF signal (traveling, respectively, clockwise and counterclockwise through the ring circuit) arrive in phase at the second terminal 12c. Likewise, the fourth terminal 12e is spaced a clockwise distance of approximately $\lambda_{RF}/2$ and a counterclockwise distance of approximately $5*\lambda_{RF}/2$ from the third terminal 12d, giving a difference of $2*\lambda_{RF}$ between these clockwise and counterclockwise distances. Therefore, the two split components of the RF signal also arrive in phase at the fourth terminal 12e.

As a result, the power of the RF signal at the third terminal 12d is distributed equally between the second terminal 12c and the fourth terminal 12e. These arrangements allow an IF signal to be generated at the frequency $f_{IF}(=f_{RF}-2*f_{LO})$ at the fifth terminal 12f and output through the IF filter circuit 22 during reception, as well as allowing a second harmonic of the LO signal to be generated (at $2*f_{LO}$) at the third terminal 12d and output as a transmission signal during transmission.

Thus, the mixer circuit 30 including the rat race circuit 34 operates in the same manner as the mixer circuit 10 including the rat race circuit 12.

Thus, the mixer circuit 30 is constructed as follows. The LO terminal 14a is connected to the first terminal 12b through the coupled line 14 and the RF open circuit 24. The diode 16 is connected between the second terminal 12c and ground potential with its cathode connected to the ground potential. The diode 20 is connected between the fourth terminal 12e and the ground potential with its cathode connected to the ground potential. The RF terminal 18a is connected to the third terminal 12d through the coupled line 18, and the IF terminal 22a is connected to the fifth terminal 12f through the IF filter circuit 22. When an RF signal is input to the third terminal 12d and an LO signal having a frequency (approximately) one-half of the frequency of the RF signal is input to the first terminal 12b, an IF signal having the frequency $f_{RF}-2*f_{LO}$ is output through the IF terminal 22a and, at the same time, a second harmonic of the LO signal is output through the RF terminal 18a. (This harmonic signal has a frequency of $2*f_{LO}$.)

Thus, a mixer circuit according to one embodiment of the present invention comprising: a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends being equally spaced of a first electrical path length from one another in that order, and the fourth coupling end to the first coupling end being spaced of a second electrical path length in the predetermined direction; a first coupling circuit for receiving a local oscillator signal having a first frequency, the first coupling circuit being connected to the first coupling end; a second coupling circuit for passing therethrough a radio frequency signal having a second frequency an even multiple of the first frequency, said second coupling circuit being connected to the third coupling end; a first diode element and a second diode element connected in the same polarity to ground potential, the first diode element being connected between the second coupling end and the ground potential, the second diode element being connected between the fourth coupling end and the ground potential; and a filter circuit for passing therethrough an intermediate frequency signal determined by the local oscillator signal and the radio frequency signal, the filter circuit being connected to a fifth coupling end provided to the transmission line at a position spaced from the first coupling end by an electrical path length of double the first electrical path length along the transmission line; wherein the first electrical path length is approximately one-quarter wavelength of the local oscillator signal and the second electrical path length is approximately three-quarters wavelength of the local oscillator signal.

Thus, in this mixer circuits, the first and second diode elements are connected in the same polarity to ground potential (i.e., either their anodes or cathodes are connected to the ground potential). This arrangement allows the first and second diode elements to be driven by a local oscillator signal having a frequency equal to a frequency of a radio frequency signal multiplied by $1/(2*n)$ (where n is a natural number) to produce an intermediate frequency signal having a frequency equal to the difference between a frequency of a input radio frequency signal having a frequency approximately equal to an even multiple (or $2*n$ multiple) of the frequency of the local oscillator signal and the radio frequency signal having the frequency equal to an even multiple (or $2*n$ multiple) of the frequency of the local oscillator signal and at the same time to produce the radio frequency signal having a frequency equal to an even multiple (or $2*n$ multiple) of the frequency of the local oscillator signal.

Further, a mixer circuit according to one embodiment of the present invention comprising: a power distribution circuit including a closed loop-shaped transmission line provided with a first coupling end, a second coupling end, a third coupling end, and a fourth coupling end in that order along the transmission line in the predetermined direction in one of clockwise and counterclockwise directions, the first to fourth coupling ends being equally spaced of a first electrical path length from one another in that order, and the fourth coupling end to the first coupling end being spaced of a second electrical path length in the predetermined direction; a first coupling circuit for receiving a local oscillator signal having a first frequency, the first coupling circuit being connected to the third coupling end; a second coupling circuit for passing therethrough a radio frequency signal having a second frequency an even multiple of the first frequency, the second coupling circuit being connected to the first coupling end; a first diode element and a second diode element connected in reverse polarity to ground potential, the first diode element being connected between the second coupling end and the ground potential, the second diode element being connected between the fourth coupling end and the ground potential; and a filter circuit for passing therethrough an intermediate frequency signal determined by the local oscillator signal and the radio frequency signal, the filter circuit being connected to a fifth coupling end provided to the transmission line at a position spaced from the first coupling end by an electrical path length of double the first electrical path length along the transmission line; wherein the first electrical path length is approximately one-quarter wavelength of the local oscillator signal and the second electrical path length is approximately three-quarters wavelength of the local oscillator signal.

Thus, in these mixer circuits, the first and second diode elements are connected in the reverse polarity to ground potential (i.e. an anode of either the first diode or the second diode is connected to the ground potential). This arrangement allows the first and second diode elements to be driven by a local oscillator signal having a frequency equal to a frequency of a radio frequency signal multiplied by $1/(2*n)$ (where n is a natural number) to produce an intermediate frequency signal having a frequency equal to the difference between a frequency of a input radio frequency signal having a frequency approximately equal to an even multiple (or $2*n$ multiple) of the frequency of the local oscillator signal and the radio frequency signal having the frequency equal to an even multiple (or $2*n$ multiple) of the frequency of the local oscillator signal and at the same time to produce the radio frequency signal having a frequency equal to an even multiple (or $2*n$ multiple) of the frequency of the local oscillator signal.

Second Embodiment

Figure 7:
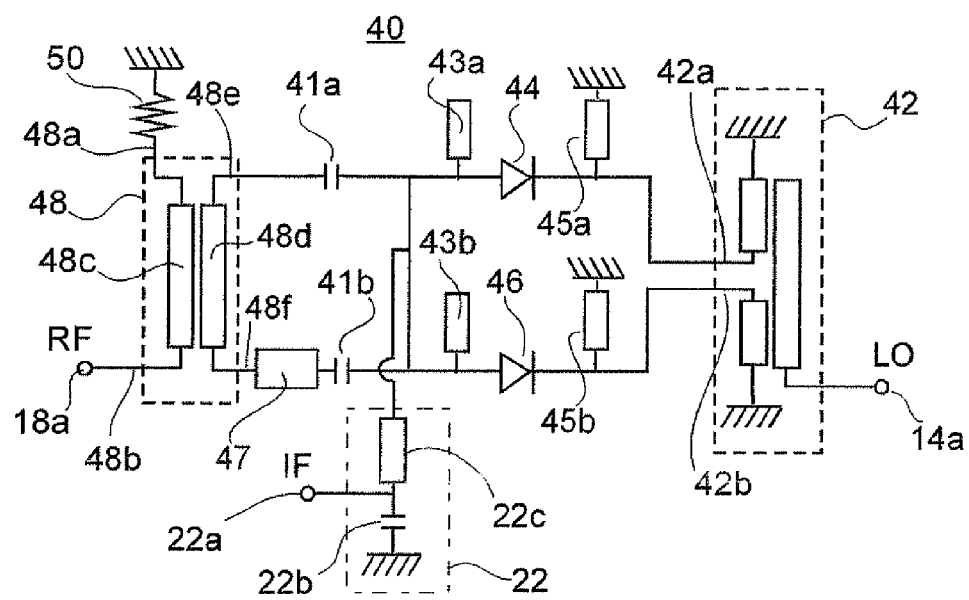
FIG. 7 is a block diagram showing a mixer circuit according to one embodiment of the present invention.

FIG. 7 is a block diagram showing a mixer circuit according to one embodiment of the present invention. Referring to FIG. 7, this mixer circuit 40 (serving as a first mixer circuit) includes a balun 42 (serving as a three terminal coupling circuit), a pair of parallel diodes 44 and 46 (serving as a first and second diode elements), a Lange coupler 48 (serving as a four terminal coupling circuit), and an IF filter circuit 22 (serving as a filter circuit). The mixer circuit 40 further includes DC/IF blocking capacitors 41a and 41b for the diodes 44 and 46, respectively, open-circuited stubs 43a and 43b, short-circuited stubs 45a and 45b, and a phase adjustment line 47 (serving as a phase adjustment circuit).

The open-circuited stubs 43a and 43b have an electrical length of one-quarter wavelength of the LO signal (i.e., $\lambda_{LO}/4$) and hence effectively appear as short circuits to the LO signal. It should be further noted that the open-circuited stubs 43a and 43b effectively appear as open circuits to the RF signal since $\lambda_{LO}/4$ is equal to one-half wavelength of the RF signal (i.e., $\lambda_{RF}/2$).

Further, the short-circuited stubs 45a and 45b have an electrical length of one-half wavelength of the RF signal (i.e., $\lambda_{RF}/2$) and hence effectively appear as short circuits to the RF signal. It should be further noted that the short-circuited stubs 45a and 45b effectively appear as open circuits to the LO signal since $\lambda_{RF}/2$ is equal to one-quarter wavelength of the LO signal (i.e., $\lambda_{LO}/4$).

The coupled line in the balun 42 has an LO terminal 14a (acting as the input end of the balun 42) and has an electrical length of one-half wavelength of the LO signal (i.e., $\lambda_{LO}/2$). Signals in phase with and 180° out of phase with the LO signal are output from the first output end 42a and the second output end 42b, respectively, of the balun 42. The cathode of the diode 44 is connected to the first output end 42a, and the cathode of the diode 46 is connected to the second output end 42b. In the mixer circuit 40, the RF signal need be short-circuited to ground before entering the LO signal circuit side, and the LO signal need be short-circuited to ground before entering the RF signal circuit side. Therefore, the short-circuited stubs 45a and 45b are connected to the cathodes of the diodes 44 and 46, respectively, to effectively short circuit the RF signal.

The first terminal 48a (serving as a first coupling end) of the Lange coupler 48 is grounded through a terminating resistance 50, and the second terminal 48b (serving as a second coupling end) of the Lange coupler 48 is connected to the RF terminal 18a. In the Lange coupler 48, a coupled line 48c (serving as a first line) has the first terminal 48a and the second terminal 48b on its respective opposite ends and has an electrical length of one-quarter wavelength of the RF signal (i.e., $\lambda_{RF}/4$).

A coupled line 48d (serving as a second line) is disposed parallel to the coupled line 48c and has a third terminal 48e (serving as a third coupling end) and a fourth terminal 48f (serving as a fourth coupling end). The third terminal 48e is connected to the anode of the diode 44 through the capacitor 41a, and the fourth terminal 48f is connected to the anode of the diode 46 through the phase adjustment line 47 and the capacitor 41b (that is, the phase adjustment line 47 is connected between the fourth terminal 48f and the capacitor 41b).

The IF filter circuit 22 is connected to the anodes of the diodes 44 and 46 and has an IF terminal 22a connected thereto. The open-circuited stubs 43a and 43b having an electrical length of one-quarter wavelength of the LO signal (i.e., $\lambda_{LO}/4$) are also connected to the anodes of the diodes 44 and 46 to effectively short circuit the LO signal.

When an RF signal is applied to the RF terminal 18a, the signal produced at the fourth terminal 48f is 90° out of phase with that produced at the third terminal 48e. However, the signal at the output of the phase adjustment line 47 connected to the fourth terminal 48f is in phase with the signal at the third terminal 48e since the phase adjustment line 47 has an electrical length of one-quarter wavelength of the RF signal (i.e., $\lambda_{RF}/4$) and hence provides a 90° phase delay. That is, the power of the input RF signal is distributed in phase between the anodes of the diodes 44 and 46. This means that the mixer circuit of the present embodiment functions in the same manner as the mixer circuits of the first embodiment.

Although in the present embodiment the cathodes of the diodes 44 and 46 are connected to the first output end 42a and the second output end 42b, respectively, of the balun 42, in other embodiments the anodes of the diodes 44 and 46 may be connected to the first output end 42a and the second output end 42b, respectively.

Further, although in the present embodiment the IF filter circuit 22 is connected to the anodes of the diodes 44 and 46, it can be connected to the cathodes of the diodes 44 and 46 if the DC/IF blocking capacitors 41a and 41b are connected between the balun 42 and the cathodes of the diodes 44 and 46, respectively.

Figure 8:
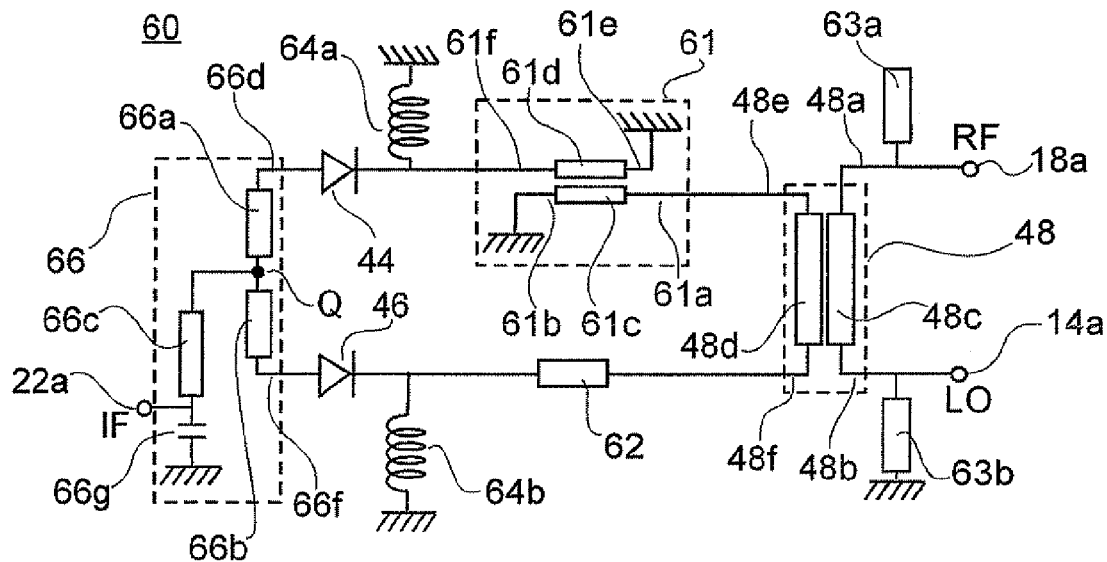
FIG. 8 is a block diagram showing a variation of the mixer circuit according to one embodiment of the present invention.

FIG. 8 is a block diagram showing a variation of the mixer circuit according to one embodiment of the present invention.

Referring to FIG. 8, this mixer circuit 60 (serving as a second mixer circuit) includes a Lange coupler 48 (serving as a first four terminal coupling circuit), a pair of parallel diodes 44 and 46 (serving as a first and second diode elements), a transmission line 62 (serving as a phase adjustment circuit), DC shunt inductors 64a and 64b, a filter circuit 66, and a coupling circuit 61 (serving as a second four terminal coupling circuit). The transmission line 62 has an electrical length of one-quarter wavelength of the LO signal (i.e., $\lambda_{LO}/4$).

The first terminal 48a (serving as a first coupling end) of the Lange coupler 48 is connected to the RF terminal 18a, and the second terminal 48b (serving as a second coupling end) of the Lange coupler 48 is connected to the LO terminal 14a. In the Lange coupler 48, a coupled line 48c (serving as a first line) has the first terminal 48a and the second terminal 48b on its respective opposite ends and has an electrical length of three-quarters wavelength of the RF signal (i.e., $3*\lambda_{RF}/4$).

A coupled line 48d (serving as a second line) is disposed parallel to the coupled line 48c and has a third terminal 48e (serving as a third coupling end) and a fourth terminal 48f (serving as a fourth coupling end). The third terminal 48e is connected to the inductor 64a and the cathode of the diode 44 through the coupling circuit 61, and the fourth terminal 48f is connected to the inductor 64b and the cathode of the diode 46 through the transmission line 62.

The first terminal 61a (serving as a first coupling end) of the coupling circuit 61 is connected to the third terminal 48e of the Lange coupler 48, and the second terminal 61b (serving as a second coupling end) of the coupling circuit 61 is grounded. In the coupling circuit 61, a coupled line 61c (serving as a first line) has the first terminal 61a and the second terminal 61b on its respective opposite ends and has an electrical length of one-quarter wavelength of the RF signal (i.e., $\lambda_{RF}/4$).

A coupled line 61d (serving as a second line) is disposed parallel to the coupled line 61c and has a third terminal 61e (serving as a third coupling end) and a fourth terminal 61f (serving as a fourth coupling end). The third terminal 61e is grounded, and the fourth terminal 61f is connected to the inductor 64a and the cathode of the diode 44.

Further, in order to enhance the isolation between the RF terminal 18a and the LO terminal 14a connected to the Lange coupler 48, an open-circuited stub 63a is connected to the RF terminal 18a, and a short-circuited stub 63b is connected to the LO terminal 14a. Both stubs have an electrical length of one-quarter wavelength of the LO signal (i.e., $\lambda_{LO}/4$).

The filter circuit 66 includes, for example, a first transmission line 66a, a second transmission line 66b, and a third transmission line 66c each having an electrical length of one-quarter wavelength of the LO signal (i.e., $\lambda_{LO}/4$). These transmission lines are arranged in a star configuration with one end of each transmission line being connected to a common junction Q (see FIG. 8).

The other end of the first transmission line 66a (which is not connected to the common junction Q) forms a first circuit terminal 66d (serving as a first coupling end) and is connected to the anode of the diode 44. The other end of the second transmission line 66b (which is not connected to the common junction Q) forms a second circuit terminal 66f (serving as a second coupling end) and is connected to the anode of the diode 46. Further, the other end of the third transmission line 66c (which is not connected to the common junction Q) is grounded through a capacitor 66g and connected to the IF terminal 22a.

Since the third transmission line 66c connected to the common junction Q is grounded through the capacitor 66g, the line effectively appears as an open circuit to the LO signal. Further, since the first transmission line 66a and the second transmission line 66b have an electrical length of one-quarter wavelength of the LO signal (i.e., $\lambda_{LO}/4$), the LO signal is effectively short-circuited between the anodes of the diodes 44 and 46 and ground.

Further, $\lambda_{LO} \approx 2*\lambda_{RF}$, which translates to the fact that the first transmission line 66a, the second transmission line 66b, the third transmission line 66c have an electrical length of one-half wavelength of the RF signal (i.e., $\lambda_{RF}/2$). Therefore, the RF signal is also effectively short-circuited between the anodes of the diodes 44 and 46 and ground.

Thus, the mixer circuits 40 and 60 can operate in the same manner as the mixer circuits of the first embodiments. Specifically, when an RF signal is input to the RF terminal 18a and an LO signal having a frequency approximately one-half of the frequency of the RF signal is input to the LO terminal 14a, an IF signal having the frequency $f_{RF}-2*f_{LO}$ is output through the IF terminal 22a and, at the same time, a second harmonic of the LO signal is output through the RF terminal 18a. (This harmonic signal has a frequency of $2*f_{LO}$.)

The signals at the third terminal 48e and the fourth terminal 48f of the Lange coupler 48 are 90° out of phase with each other. However, by the action of the transmission line 62 and the coupling circuit 61, the power of the LO signal is distributed equally and 180° out of phase between the diodes 44 and 46, and the power of the RF signal is distributed equally and in phase between these diodes. This means that this mixer circuit also functions in the same manner as the mixer circuits of the first embodiment.

Figure 9:
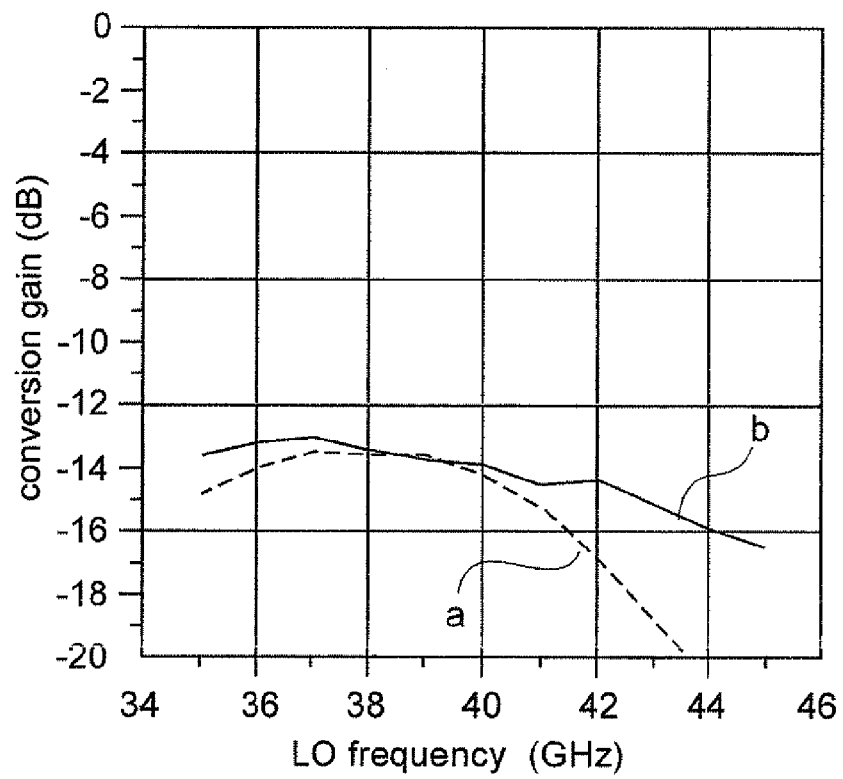
FIG. 9 is a graph showing calculated values of the transmission conversion gain and the reception conversion gain of the mixer circuit according to one embodiment of the present invention.

FIG. 9 is a graph showing calculated values of the transmission conversion gain and the reception conversion gain of the mixer circuit according to one embodiment of the present invention.

In FIG. 9, the horizontal axis represents the frequency of the local oscillator signal, and the vertical axis represents conversion gain. Symbol a indicates the transmission conversion gain, and symbol b indicates the reception conversion grain.

For example, when $f_{LO}$ is 38 GHz, the reception conversion gain and the transmission conversion gain are approximately −13 dB.

Although in the mixer circuit 60 of the present embodiment the cathodes of the diodes 44 and 46 are indirectly connected to the Lange coupler 48, in other embodiments their anodes may be indirectly connected to the Lange coupler 48. Further, the coupling circuit 61 may be a Lange coupler including three or more lines.

Thus, a mixer circuit according to one embodiment of the present invention comprising: a three terminal coupling circuit including an input end for receiving a local oscillator signal having a predetermined frequency, a first output end and a second output end for outputting signals 180° out of phase with each other; a first diode element and a second diode element connected in the same polarity to the first output end and the second output end, respectively, of the three terminal coupling circuit; a four terminal coupling circuit including, a first line having a first coupling end grounded through a terminating resistance and a second coupling end for passing therethrough a radio frequency signal having a frequency an even multiple of the predetermined frequency of the local oscillator signal, the first line having an electrical length of approximately one-quarter wavelength of the radio frequency signal between the first and second coupling ends, a second line disposed parallel to the first line, having a third coupling end connected to the first output end of the three terminal coupling circuit through the first diode element and a fourth coupling end connected to the second output end of the three terminal coupling circuit through the second diode element, the third coupling end and the fourth coupling end being juxtaposed to the first and second coupling ends, respectively, of the first line; a phase adjustment circuit connected between the fourth coupling end of the four terminal coupling circuit and the second diode element and having an electrical length of approximately one-quarter wavelength of the radio frequency signal; and a filter circuit for passing therethrough an intermediate frequency signal determined by the local oscillator signal and the radio frequency signal, the filter circuit being either connected to the junctions between the phase adjustment circuit and the second diode element and between the third coupling end of the four terminal coupling circuit and the first diode element, or connected to the junctions between the first diode element and the three terminal coupling circuit and between the second diode element and the three terminal coupling circuit.

Further, a mixer circuit according to one embodiment of the present invention comprising: a first four terminal coupling circuit including, a first line having a first coupling end for passing therethrough a radio frequency signal having a frequency an even multiple of a predetermined frequency of a local oscillator signal and a second coupling end for receiving the local oscillator signal having the predetermined frequency, the first line having an electrical length of approximately one-quarter wavelength of the radio frequency signal between the first and second coupling ends, and the second line disposed parallel to the first line and having a third coupling end and a fourth coupling end juxtaposed to the first and second coupling ends, respectively, of the first line; a first diode element and a second diode element indirectly connected in the same polarity to the third coupling end and the fourth coupling end, respectively, of the first four terminal coupling circuit; a phase adjustment circuit connected between the second diode element and the fourth coupling end of the first four terminal coupling circuit and having an electrical length of approximately one-quarter wavelength of the local oscillator signal; a second four terminal coupling circuit including, a first line having a first coupling end connected to the third coupling end of said first four terminal coupling circuit and a second coupling end grounded, the first line having an electrical length of approximately one-quarter wavelength of the local oscillator signal between the first and second coupling ends, and a second line disposed parallel to the first line having a third coupling end grounded and a fourth coupling end connected to the first diode element, the second line having the third coupling end and the fourth coupling end juxtaposed to the first and second coupling ends, respectively, of the first line, and the second four terminal coupling circuit being connected between the third coupling end of the first four terminal coupling circuit and the first diode element; a filter circuit for passing therethrough an intermediate frequency signal determined by the local oscillator signal and the radio frequency signal including, a first coupling end connected to the first diode element indirectly connected to the third coupling end of the first four terminal coupling circuit, and a second coupling end connected to the second diode element indirectly connected to the fourth coupling end of the first four terminal coupling circuit.

Thus, in these mixer circuits, These arrangement allow the first and second diode elements to be driven by a local oscillator signal having a frequency equal to a frequency of a radio frequency signal multiplied by 1/(2*n) (where n is a natural number) to produce an intermediate frequency signal having a frequency equal to the difference between a frequency of a input radio frequency signal having a frequency approximately equal to an even multiple (or 2*n multiple) of the frequency of the local oscillator signal and the radio frequency signal having the frequency equal to an even multiple (or 2*n multiple) of the frequency of the local oscillator signal and at the same time to produce the radio frequency signal having a frequency equal to an even multiple (or 2*n multiple) of the frequency of the local oscillator signal.

Third Embodiment

Figure 10:
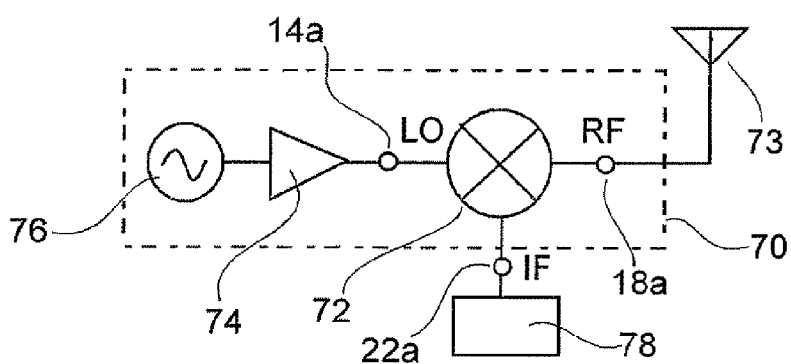
FIG. 10 is a block diagram showing a radar device including a radar transceiver according to one embodiment of the present invention.

FIG. 10 is a block diagram showing a radar device including a radar transceiver according to one embodiment of the present invention.

Referring to FIG. 10, a transmitting/receiving antenna 73 is coupled to the RF terminal 18a of the mixer circuit 72 of the transceiver 70, and an IF processing device 78 (serving as a intermediate frequency signal processing circuit) is connected to the IF terminal of the mixer circuit 72. In the transceiver 70, an oscillator 76 (serving as a local oscillator circuit) is connected to the LO terminal 14a of the mixer circuit 72 through an amplifier 74.

It should be noted that the frequency $f_{RF}$ of the RF signal is within the W-band and the frequency $f_{LO}$ of the LO signal is $f_{RF}/2$. That is, the frequency $f_{LO}$ falls within the Ka-band.

Figure 11:
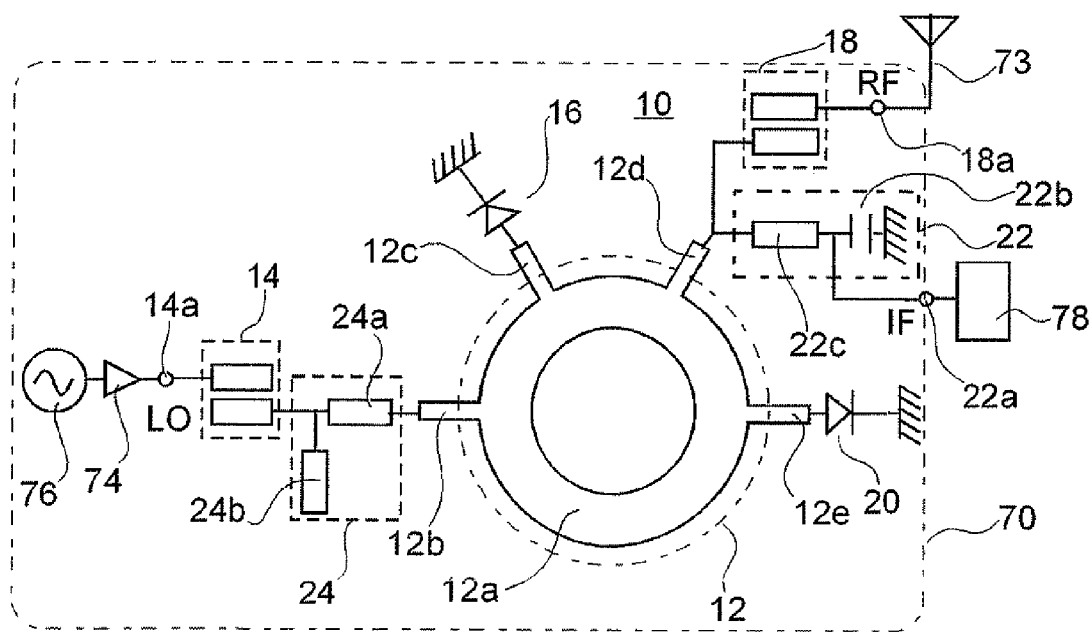
FIG. 11 is a block diagram showing a radar device that includes a transceiver employing a mixer circuit according to one embodiment of the present invention.

FIG. 11 is a block diagram showing a radar device that includes a transceiver employing a mixer circuit according to one embodiment of the present invention. Although in the present embodiment the transceiver includes the mixer circuit 10 of the first embodiment, it may include any one of the mixer circuits according to the present invention.

During transmission, the LO signal generated by the oscillator 76 is amplified by the Ka-band amplifier 74, up-converted to a W-band frequency by the mixer circuit 10, and then delivered to the transmitting/receiving antenna 73 through the RF terminal 18a for transmission.

During reception, the W-band RF signal received by the transmitting/receiving antenna 73 is delivered through the RF terminal 18a to the mixer circuit 10, which down-converts the RF signal to an IF signal by mixing the RF signal with the Ka-band LO signal generated by the oscillator 76, and sends the IF signal to the IF processing device 78 through the IF terminal.

The mixer circuit 10 used in the transceiver 70 has a function to receive an RF signal and down-convert it to an IF signal, and a function to up-convert the LO signal to a frequency which is an even multiple of the original frequency.

Therefore, this mixer circuit can generate a W-band signal from a Ka-band signal, making it possible to design a W-band transceiver made up of Ka-band devices.

Furthermore, the mixer circuit allows the transceiver to use a transmitting/receiving (or bidirectional) antenna without using a switch or circulator, resulting in a reduction in the size of the radar device. Further, the radar device can continuously operate without interruption since it can perform transmission and reception operations concurrently.

Thus, A radar transceiver according to the present invention comprising: any one of the mixer circuits of the first and second embodiments; and a local oscillator circuit connected to the first coupling circuit of the mixer circuit; wherein a transmitting/receiving antenna is coupled to the second coupling circuit of the mixer circuit; and wherein an intermediate frequency signal processing circuit is connected to the filter circuit of the mixer circuit.

A radar transceiver, also, according to the present invention comprising: the first mixer circuit of the second embodiment; and a local oscillator circuit connected to the input end of the three terminal coupling circuit of the mixer circuit; wherein a transmitting/receiving antenna is coupled to the second coupling end of the four terminal coupling circuit of the mixer circuit; and wherein an intermediate frequency signal processing circuit is connected to the filter circuit of the mixer circuit.

A radar transceiver, also, according to the present invention comprising: the second mixer circuit of the second embodiment; and a local oscillator circuit connected to the second coupling end of the first four terminal coupling circuit of the mixer circuit; wherein a transmitting/receiving antenna is coupled to the first coupling end of the first four terminal coupling circuit of the mixer circuit; and wherein an intermediate frequency signal processing circuit is connected to the filter circuit of the mixer circuit.

Thus, these radar transceivers can generate an even harmonic of the local oscillator signal while at the same time receiving a radio frequency signal and down-converting it to an intermediate frequency signal by mixing the radio frequency signal with the local oscillator signal. This allows the radar device to perform transmission and reception operations concurrently and thereby continuously operate without interruption. Further, the transceivers can use a transmitting/receiving (or bidirectional) antenna without using a switch or circulator, resulting in a reduction in the size of the radar device.

Thus, the mixer circuits and the radar transceivers of the present invention are suitable for use in electronic devices, such as automobile radar devices and millimeter wave radar devices, as well as in microwave and millimeter wave communication devices for mobile communications and wireless communications.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A mixer circuit comprising:
   a power distribution circuit including a closed loop transmission line having a first coupling end, a second coupling end, a third coupling end, and a fourth coupling end, arranged in that order, along the transmission line in a predetermined direction that is one of clockwise and counterclockwise directions, the first to fourth coupling ends being equally spaced by a first electrical path length from one another, in that order, and the fourth coupling end being spaced from the first coupling end by a second electrical path length in the predetermined direction;
   a first coupling circuit for receiving a local oscillator signal at a first frequency, said first coupling circuit being connected to the first coupling end;
   a second coupling circuit for passing a radio frequency signal at a second frequency that is an even multiple of the first frequency, said second coupling circuit being connected to the third coupling end;
   a first diode element and a second diode element connected in the same polarity to ground potential, said first diode element being connected between the second coupling end and the ground potential, said second diode element being connected between the fourth coupling end and the ground potential; and
   a filter circuit for passing an intermediate frequency signal determined by the local oscillator signal and the radio frequency signal, said filter circuit being connected to a fifth coupling end of said transmission line at a position spaced from the first coupling end by an electrical path length of double the first electrical path length along said transmission line, wherein the first electrical path length is approximately one-quarter of one wavelength of the local oscillator signal and the second electrical path length is approximately three-quarters of one wavelength of the local oscillator signal.

2. The mixer circuit according to claim 1, wherein the fifth coupling end is coincident with the third coupling end.

3. The mixer circuit according to claim 1, wherein the fifth coupling end is in inverse direction of the predetermined direction from the first coupling end.

4. A mixer circuit comprising:
   a power distribution circuit including a closed loop transmission line having a first coupling end, a second coupling end, a third coupling end, and a fourth coupling end, arranged in that order, along the transmission line in a predetermined directions that is one of clockwise and counterclockwise directions, the first to fourth coupling ends being equally spaced by a first electrical path length from one another, in that order, and the fourth coupling end being spaced from the first coupling end by a second electrical path length in the predetermined direction;
   a first coupling circuit for receiving a local oscillator signal at a first frequency, said first coupling circuit being connected to the third coupling end;
   a second coupling circuit for passing a radio frequency signal at a second frequency that is an even multiple of the first frequency, said second coupling circuit being connected to the first coupling end;
   a first diode element and a second diode element connected in reverse polarity to ground potential, said first diode element being connected between the second coupling end and the ground potential, said second diode element being connected between the fourth coupling end and the ground potential; and a filter circuit for passing an intermediate frequency signal determined by the local oscillator signal and the radio frequency signal, said filter circuit being connected to a fifth coupling end of said transmission line at a position spaced from the first coupling end by an electrical path length of double the first electrical path length along said transmission line, wherein the first electrical path length is approximately one-quarter of one wavelength of the local oscillator signal and the second electrical path length is approximately three-quarters of one wavelength of the local oscillator signal.

5. The mixer circuit according to claim 1, further comprising a high impedance circuit effectively appearing as an open circuit to the radio frequency signal, wherein said first coupling circuit is connected to said power distribution circuit through said high impedance circuit.

6. The mixer circuit according to claim 4, further comprising a high impedance circuit effectively appearing as an open circuit to the radio frequency signal, wherein said first coupling circuit is connected to said power distribution circuit through said high impedance circuit.

7. A mixer circuit comprising:

a three terminal coupling circuit including an input end for receiving a local oscillator signal having a predetermined frequency, a first output end and a second output end for outputting signals 180° out of phase with each other;

a first diode element and a second diode element connected in the same polarity to the first output end and the second output end, respectively, of said three terminal coupling circuit;

a four terminal coupling circuit including, a first line having a first coupling end grounded through a terminating resistance and a second coupling end for passing a radio frequency signal having a frequency that is an even multiple of the predetermined frequency of the local oscillator signal, said first line having an electrical length of approximately one-quarter of one wavelength of the radio frequency signal between the first and second coupling ends, and a second line disposed parallel to said first line, having a third coupling end connected to the first output end of said three terminal coupling circuit through said first diode element and a fourth coupling end connected to the second output end of said three terminal coupling circuit through said second diode element, the third coupling end and the fourth coupling end being juxtaposed to the first and second coupling ends, respectively of said first line;

a phase adjustment circuit connected between the fourth coupling end of said four terminal coupling circuit and said second diode element and having an electrical length of approximately one-quarter of one wavelength of the radio frequency signal; and a filter circuit for passing an intermediate frequency signal determined by the local oscillator signal and the radio frequency signal, said filter circuit being connected either to (i) junctions between said phase adjustment circuit and said second diode element and between the third coupling end of said four terminal coupling circuit and said first diode element, or (ii) junctions between said first diode element and said three terminal coupling circuit and between said second diode element and said three terminal coupling circuit.

8. A mixer circuit comprising:

a first four terminal coupling circuit including a first line having a first coupling end for passing a radio frequency signal having a frequency that is an even multiple of a predetermined frequency of a local oscillator signal and a second coupling end for receiving the local oscillator signal having the predetermined frequency, said first line having an electrical length between the first and second coupling ends of approximately one-quarter of one wavelength of the radio frequency signal, and a second line disposed parallel to said first line and having a third coupling end and a fourth coupling end juxtaposed to the first and second coupling ends, respectively, of said first line;

a first diode element and a second diode element indirectly connected in the same polarity to the third coupling end and the fourth coupling end, respectively, of said first four terminal coupling circuit;

a phase adjustment circuit connected between said second diode element and the fourth coupling end of said first four terminal coupling circuit and having an electrical length of approximately one-quarter of one wavelength of the local oscillator signal;

a second four terminal coupling circuit including a first line having a first coupling end connected to the third coupling end of said first four terminal coupling circuit and a second coupling end grounded, said first line having an electrical length of approximately one-quarter of one wavelength of the local oscillator signal between the first and second coupling ends, and a second line disposed parallel to said first line and having a third coupling end grounded and a fourth coupling end connected to said first diode element, said second line having the third coupling end and the fourth coupling end juxtaposed to the first and second coupling ends, respectively, of said first line, wherein said second four terminal coupling circuit is connected between the third coupling end of said first four terminal coupling circuit and said first diode element;

a filter circuit for passing an intermediate frequency signal determined by the local oscillator signal and the radio frequency signal and including a first coupling end connected to said first diode element indirectly connected to the third coupling end of said first four terminal coupling circuit, and a second coupling end connected to said second diode element indirectly connected to said fourth coupling end of the first four terminal coupling circuit.

9. A radar transceiver comprising:

a mixer circuit comprising a power distribution circuit including a closed loop transmission line having a first coupling end, a second coupling end, a third coupling end, and a fourth coupling end, arranged in that order, along the transmission line in a predetermined direction that is one of clockwise and counterclockwise directions, the first to fourth coupling ends being equally spaced by a first electrical path length from one another, in that order, and the fourth coupling end being spaced from the first coupling end by a second electrical path length in the predetermined direction, a first coupling circuit for receiving a local oscillator signal at a first frequency, said first coupling circuit being connected to the first coupling end, a second coupling circuit for passing a radio frequency signal at a second frequency that is an even multiple of the first frequency, said second coupling circuit being connected to the third coupling end, a first diode element and a second diode element connected in the same polarity to ground potential, said first diode element being connected between the second coupling end and the ground potential, said second diode element being connected between the fourth coupling end and the ground potential, and a filter circuit for passing an intermediate frequency signal determined by the local oscillator signal and the radio frequency signal, said filter circuit being connected to a fifth coupling end of said transmission line at a position spaced from the first coupling end by an electrical path length of double the first electrical path length along said transmission line, wherein the first electrical path length is approximately one-quarter of one wavelength of the local oscillator signal and the second electrical path length is approximately three-quarters of one wavelength of the local oscillator;

a local oscillator circuit connected to said first coupling circuit of said mixer circuit;

a transmitting/receiving antenna coupled to said second coupling circuit of said mixer circuit; and an intermediate frequency signal processing circuit connected to said filter circuit of said mixer circuit.

10. A radar transceiver comprising:

a mixer circuit comprising a power distribution circuit including a closed loop transmission line having a first coupling end, a second coupling end, a third coupling end, and a fourth coupling end, arranged in that order, along the transmission line in a predetermined direction that is one of clockwise and counterclockwise directions, the first to fourth coupling ends being equally spaced by a first electrical path length from one another, in that order, and the fourth coupling end being spaced from the first coupling end by a second electrical path length in the predetermined direction, a first coupling circuit for receiving a local oscillator signal at a first frequency, said first coupling circuit being connected to the third coupling end, a second coupling circuit for passing a radio frequency signal at a second frequency that is an even multiple of the first frequency, said second coupling circuit being connected to the first coupling end, a first diode element and a second diode element connected in reverse polarity to ground potential, said first diode element being connected between the second coupling end and the ground potential, said second diode element being connected between the fourth coupling end and the ground potential, and a filter circuit for passing an intermediate frequency signal determined by the local oscillator signal and the radio frequency signal, said filter circuit being connected to a fifth coupling end of said transmission line at a position spaced from the first coupling end by an electrical path length of double the first electrical path length along said transmission line, wherein the first electrical path length is approximately one-quarter of one wavelength of the local oscillator signal and the second electrical path length is approximately three-quarters of one wavelength of the local oscillator signal;

a local oscillator circuit connected to said first coupling circuit of said mixer circuit;

a transmitting/receiving antenna coupled to said second coupling circuit of said mixer circuit; and an intermediate frequency signal processing circuit connected to said filter circuit of said mixer circuit.

11. A radar transceiver comprising:

a mixer circuit comprising a three terminal coupling circuit including an input end for receiving a local oscillator signal having a predetermined frequency, a first output end and a second output end for outputting signals 180° out of phase with each other, a first diode element and a second diode element connected in the same polarity to the first output end and the second output end, respectively, of said three terminal coupling circuit, a four terminal coupling circuit including a first line having a first coupling end grounded through a terminating resistance and a second coupling end for passing a radio frequency signal having a frequency that is an even multiple of the predetermined frequency of the local oscillator signal, said first line having an electrical length of approximately one-quarter of one wavelength of the radio frequency signal between the first and second coupling ends, a second line disposed parallel to said first line, having a third coupling end connected to the first output end of said three terminal coupling circuit through said first diode element and a fourth coupling end connected to the second output end of said three terminal coupling circuit through said second diode element, the third coupling end and the fourth coupling end being juxtaposed to the first and second coupling ends, respectively, of said first line, a phase adjustment circuit connected between the fourth coupling end of said four terminal coupling circuit and said second diode element and having an electrical length of approximately one-quarter of one wavelength of the radio frequency signal, and a filter circuit for passing an intermediate frequency signal determined by the local oscillator signal and the radio frequency signal, said filter circuit being connected either to (i) junctions between said phase adjustment circuit and said second diode element and between the third coupling end of said four terminal coupling circuit and said first diode element, or (ii) junctions between said first diode element and said three terminal coupling circuit and between said second diode element and said three terminal coupling circuit;

a local oscillator circuit connected to the input end of said three terminal coupling circuit of said mixer circuit;

a transmitting/receiving antenna coupled to the second coupling end of the said four terminal coupling circuit of said mixer circuit; and an intermediate frequency signal processing circuit connected to said filter circuit of said mixer circuit.

12. A radar transceiver comprising:

a mixer circuit comprising, a first four terminal coupling circuit including a first line having a first coupling end for passing a radio frequency signal having a frequency that is an even multiple of a predetermined frequency of a local oscillator signal and a second coupling end for receiving the local oscillator signal having the predetermined frequency, said first line having an electrical length between the first and second coupling ends of approximately one-quarter of one wavelength of the radio frequency signal, and
a second line disposed parallel to said first line and having a third coupling end and a fourth coupling end juxtaposed to the first and second coupling ends, respectively, of said first line,
a first diode element and a second diode element indirectly connected in the same polarity to the third coupling end and the fourth coupling end, respectively, of said first four terminal coupling circuit,
a phase adjustment circuit connected between said second diode element and the fourth coupling end of said first four terminal coupling circuit and having an electrical length of approximately one-quarter of one wavelength of the local oscillator signal,
a second four terminal coupling circuit including
a first line having a first coupling end connected to the third coupling end of said first four terminal coupling circuit and a second coupling end grounded, said first line having an electrical length of approximately one-quarter of one wavelength of the local oscillator signal between the first and second coupling ends, and
a second line disposed parallel to said first line and having a third coupling end grounded and a fourth coupling end connected to said first diode element, said second line having the third coupling end and the fourth coupling end juxtaposed to the first and second coupling ends, respectively, of said first line, wherein said second four terminal coupling circuit is connected between the third coupling end of said first four terminal coupling circuit and said first diode element;
a filter circuit for passing an intermediate frequency signal determined by the local oscillator signal and the radio frequency signal and including
a first coupling end connected to said first diode element indirectly connected to the third coupling end of said first four terminal coupling circuits, and
a second coupling end connected to said second diode element indirectly connected to said fourth coupling end of the first four terminal coupling circuit;
a local oscillator circuit connected to the second coupling end of said first four terminal coupling circuit of said mixer circuit;
a transmitting/receiving antenna coupled to the first coupling end of said first four terminal coupling circuit of said mixer circuit; and
an intermediate frequency signal processing circuit connected to said filter circuit of said mixer circuit.

* * * * *